United States Patent
Sultan et al.

(10) Patent No.: US 6,346,463 B1
(45) Date of Patent: Feb. 12, 2002

(54) METHOD FOR FORMING A SEMICONDUCTOR DEVICE WITH A TAILORED WELL PROFILE

(75) Inventors: Akif Sultan; Frederick N. Hause, both of Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/565,858

(22) Filed: May 5, 2000

(51) Int. Cl.$^7$ ................................................ H01L 21/04
(52) U.S. Cl. ........................................ 438/510; 438/514
(58) Field of Search ................................ 438/510, 268, 438/138, 514

(56) References Cited

U.S. PATENT DOCUMENTS 5,597,742 A * 1/1997 Zambrano ..................... 437/31
6,228,719 B1 * 5/2001 Frisina et al. ................ 438/268

* cited by examiner

Primary Examiner—Richard Elms
Assistant Examiner—Brad Smith

(74) Attorney, Agent, or Firm—Williams, Morgan & Amerson, P.C.

(57) ABSTRACT

A method for forming a semiconductor device is provided. A base layer is provided. A first epitaxial layer having a first dopant at a first concentration is formed above the base layer. A second epitaxial layer having a second dopant at a second concentration is formed above the first epitaxial layer. The second concentration is greater than the first concentration. A third epitaxial layer having a third dopant at a third concentration is formed above the second epitaxial layer. The third concentration is less than the second concentration. Ions are implanted in the third epitaxial layer to form an implant region. The implant region is in contact with the second epitaxial layer. A semiconductor device comprises a base layer, first, second, and third epitaxial layers, and an implant region. The first epitaxial layer has a first dopant at a first concentration disposed above the base layer. The second epitaxial layer has a second dopant at a second concentration disposed above the first epitaxial layer. The second concentration is greater than the first concentration. The third epitaxial layer has a third dopant at a third concentration disposed above the second epitaxial layer. The third concentration is less than the second concentration. The implant region is defined in the third epitaxial layer and is in contact with the second epitaxial layer.

12 Claims, 5 Drawing Sheets

METHOD FOR FORMING A SEMICONDUCTOR DEVICE WITH A TAILORED WELL PROFILE

BACKGROUND OF THE INVENTION

1. Field of the Invention

This invention relates generally to semiconductor manufacturing, and, more particularly, to a method for forming a semiconductor device with a tailored well profile.

2. Description of the Related Art

The manufacture of semiconductor devices frequently calls for doping a semiconductor substrate. The semiconductor substrate, or simply the "substrate," is an underlying layer of material upon which a device or circuit is fabricated. To effect the electrical properties of the substrate various ions (e.g., dopants) are intentionally added to the silicon substrate to make it semi-conductive. Generally there are two types of dopants, positive-type (i.e., p-type) and negative-type (i.e., n-type). In current semiconductor device applications, the substrate includes a base layer of highly doped p-type silicon, covered by a layer of lightly doped p-type silicon, commonly formed above the substrate using an epitaxial growth process. This upper layer is commonly referred to as the EPI layer. Semiconductor manufacturers typically buy wafers with preformed EPI layers in bulk quantities and perform subsequent processing steps to form semiconductor devices on the wafer. The combination of the base silicon layer and the EPI layer are collectively referred to as the substrate.

To implement conducting features in the resultant device, portions of the EPI layer are doped with n-type or p-type dopants to create either n-type or p-type semiconductive pockets (e.g., commonly referred to as wells) in the substrate. Commonly, a semiconductor device includes both n-wells and p-wells. Individual devices, such as transistors, are formed in the various wells to construct the semiconductor device.

One early approach to introducing dopants into the EPI layer to form the wells involved the use of a process known as "thermal diffusion." In thermal diffusion, the substrate is generally covered by a mask having holes that expose selected portions of the substrate. The wafer, i.e., the substrate and mask, are then heated to approximately 1000° C. in the presence of a vapor of the dopant material. The dopant then diffuses into the substrate through the holes in the mask to create the n-wells or p-wells. A more thorough treatment of the general principles of thermal diffusion may be found in Peter van Zant, Microchip Fabrication, pp. 312–330 (3d Ed. McGraw-Hill New York 1997) (ISBN 0-07-067250-4).

As the technology matured, the sizes of the features being constructed decreased dramatically. Eventually, thermal diffusion processes reached problematical technological limitations. One such limitation is "lateral diffusion," which is the phenomenon by which the dopant diffuses not only down into the substrate, but also laterally beyond the openings in the mask. This means the designer must leave extra space between openings to account for the lateral diffusion. As feature sizes decrease, the negative contribution of this limitation increases. Other problems include ultra-thin junctions, poor doping control, surface contamination interference, and dislocation generation.

The industry consequently turned to a physical process called "ion implantation." In ion implantation, atoms of the dopant material are ionized, accelerated to a high speed, and "shot" into the wafer surface. One analogy to this process is the a cannon ball shot into a wall. If shot with the right amount of force at a wall, the cannon ball will penetrate the wall and come to rest in the wall but below its surface. See van Zant, supra, p. 332. In a typical ion implantation process, the substrate is covered with a mask having openings formed therein and bombarded with dopant ions at high energy through the openings in the mask. The dopant ions thus create the n-wells and/or p-wells in the substrate. Additional information on general ion implantation principles may be found in van Zant, supra, pp. 332–347.

More technically, ion implantation is a semiconductor doping process whereby a plurality of dopant atoms are first ionized, accelerated to velocities sufficient to penetrate the semiconductor surface, and implanted therein. Dopants generally come in either p-type or n-type. P-type dopants (including boron, aluminum, gallium, thallium, indium and/or silicon) produce what is commonly known as hole conductivity, while n-type dopants (including phosphorous, arsenic, and/or antimony) produce what is commonly known as electron conductivity. Combinations of hole and electron-rich regions produce the desired devices such as transistors, resistors, diodes, capacitors, etc., that form the basis of semiconductor device operation. Recent advances in semiconductor manufacture include fine-line geometries of dopant materials on a substrate to form very large scale integrated devices.

Ion implantation resolves many of the problems from which thermal diffusion suffers and provides additional benefits. Among the benefits of ion implantation are: the process takes place at close to room temperature; the dopant is placed below the substrate surface; the concentration and location of the dopants can be more accurately controlled; a wider range of doping concentrations may be achieved; and greater flexibility in masking materials may be exercised. The greater control and relative lack of lateral diffusion make ion implantation especially useful in manufacturing devices with high density and small feature sizes. Because of these many benefits, ion implantation has largely displaced thermal diffusion, although thermal diffusion still finds some use.

Ion implantation, however, is not without its own limitations. The equipment is complex and expensive. The process employs higher voltages and more toxic gases than does thermal diffusion. A well is typically made using a series of implants (e.g., between 4 and 6) to provide dopant ions at different depths in the substrate. A subsequent annealing process is used to homogenize the various independent dopant layers and to repair damage to the lattice structures of the target material caused by the implantation process. One of the more important problems with ion implantation arises from the high energies used to create wells of adequate depth. The mask layer used to protect areas of the substrate where well formation is not desired must accommodate the deepest (i.e., highest energy) implant.

A cross section view of a partially completed semiconductor device 10 is shown in FIG. 1. The semiconductor device 10 includes a base layer 20 on which an epitaxial silicon (EPI) layer 30 has been formed. A photoresist layer 40 has been formed and patterned to expose portion of the EPI layer 30 where well formation is desirable. Wells 50 are formed by implanting dopant ions into the exposed portions of the EPI layer 30. The thickness of the photoresist layer 40 is dictated by the energy of the highest energy well implant. Such high energy implants necessitate relatively thick masks that, when used to fabricate small features, create a very large "aspect ratio."

The portion 60 of the photoresist layer 30 disposed between the wells 50 exhibits such a high aspect ratio. Large aspect ratios reduce the achievable resolution with which the various features, such as the wells 50, may be created. When the photoresist layer 40 is being patterned, it is typically developed in a wet environment. When a large aspect ratio mask feature 60 is formed between closely spaced wells 40, the photoresist my fail to adhere to the substrate or may tip over during the developing process, thus compromising its functionality.

The present invention is directed to overcoming, or at least reducing the effects of, one or more of the problems set forth above.

SUMMARY OF THE INVENTION

One aspect of the present invention is seen in a method for forming a semiconductor device. A base layer is provided. A first epitaxial layer having a first dopant at a first concentration is formed above the base layer. A second epitaxial layer having a second dopant at a second concentration is formed above the first epitaxial layer. The second concentration is greater than the first concentration. A third epitaxial layer having a third dopant at a third concentration is formed above the second epitaxial layer. The third concentration is less than the second concentration. Ions are implanted in the third epitaxial layer to form an implant region. The implant region is in contact with the second epitaxial layer.

Another aspect of the present invention is seen in a semiconductor device including a base layer, first, second, and third epitaxial layers, and an implant region. The first epitaxial layer has a first dopant at a first concentration disposed above the base layer. The second epitaxial layer has a second dopant at a second concentration disposed above the first epitaxial layer. The second concentration is greater than the first concentration. The third epitaxial layer has a third dopant at a third concentration disposed above the second epitaxial layer. The third concentration is less than the second concentration. The implant region is defined in the third epitaxial layer and is in contact with the second epitaxial layer.

BRIEF DESCRIPTION OF THE DRAWINGS

The invention may be understood by reference to the following description taken in conjunction with the accompanying drawings, in which like reference numerals identify like elements, and in which.

Figure 1:
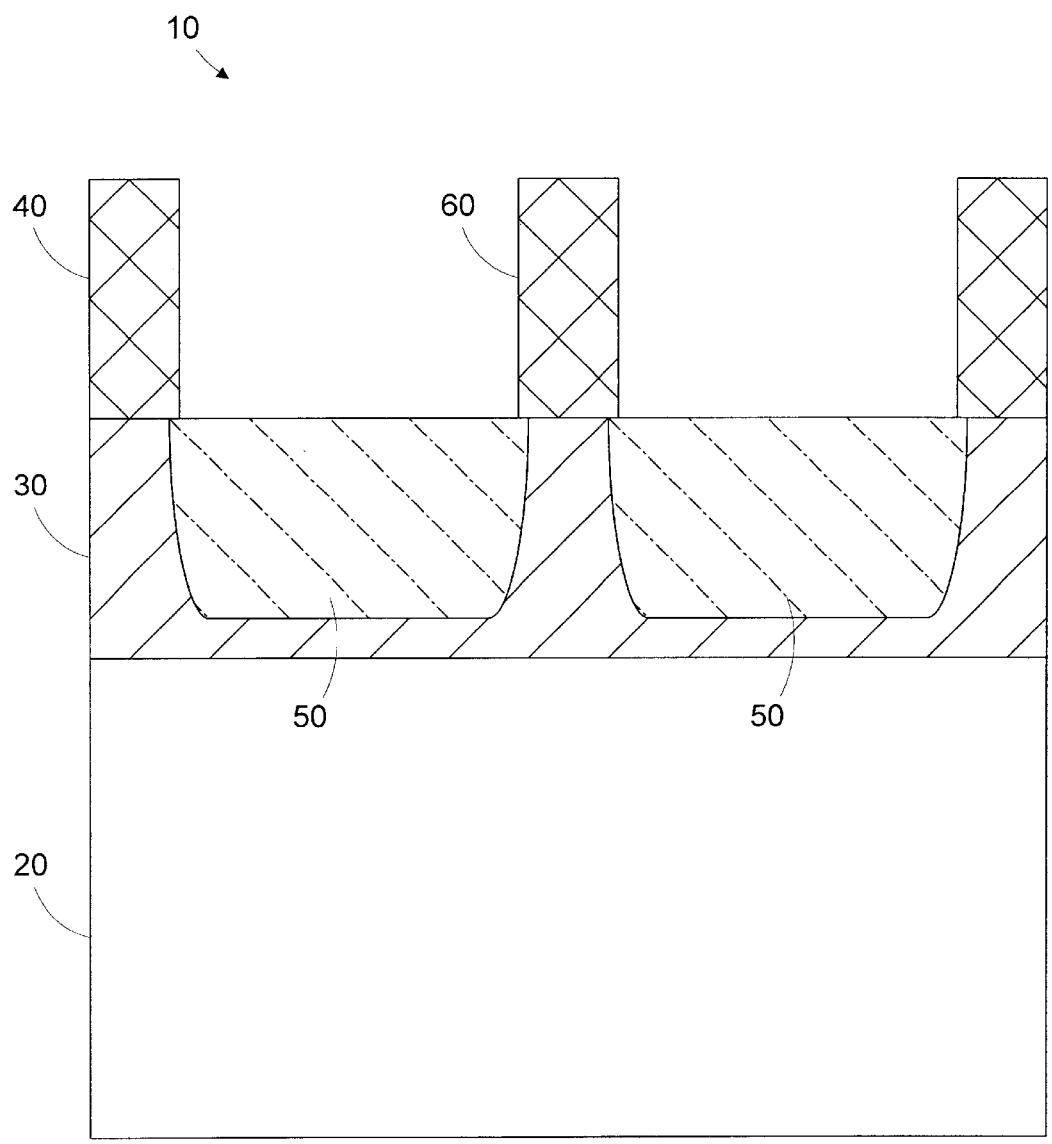
FIG. 1 is a cross section view of a partially completed prior art semiconductor device.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

FIGS. 2 through 5 illustrate a method for forming wells in a semiconductor device in accordance with the present invention. Although the various regions and structures of the semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

Figure 2:
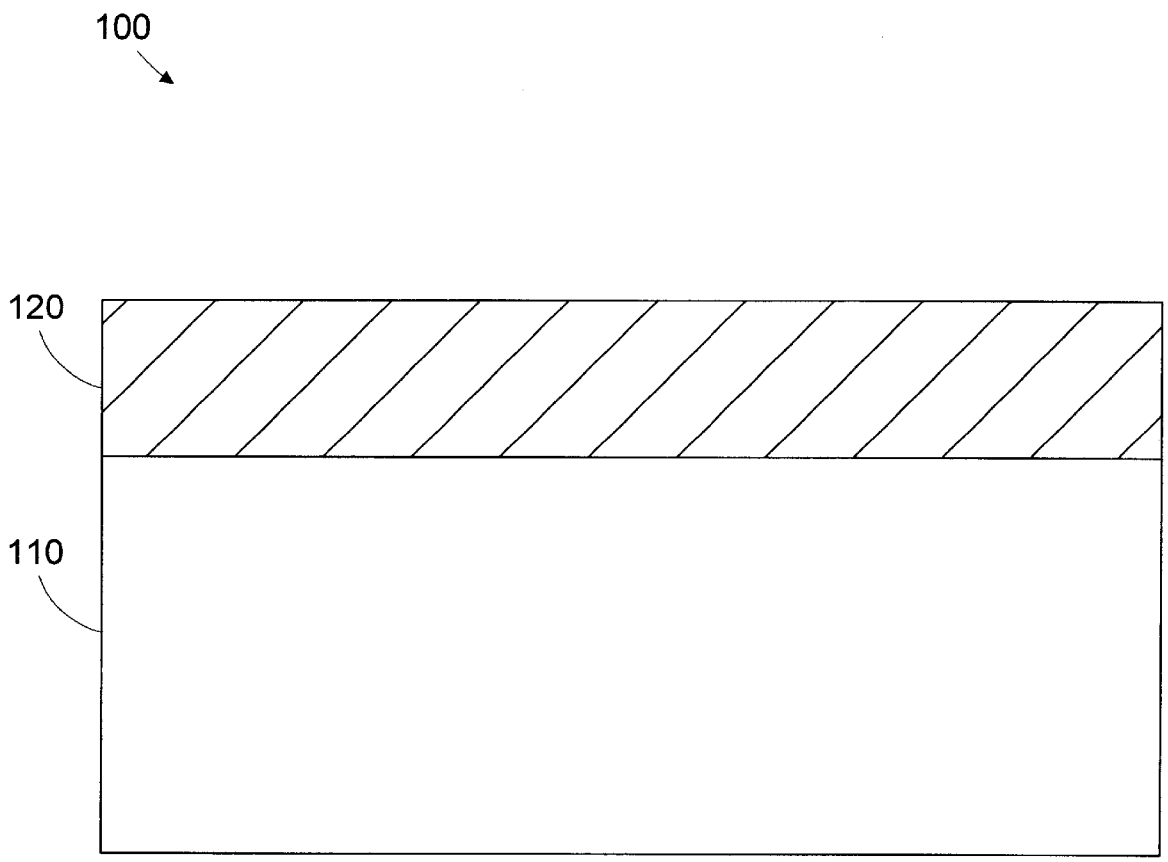
FIG. 2 is a cross section view of a partially completed semiconductor device including a lightly doped epitaxial layer formed above a base layer in accordance with one embodiment of the present invention.

Referring to FIG. 2, a cross section view of a partially completed semiconductor device 100 in accordance with the present invention is provided. The semiconductor device 100 includes a base layer 110 on which a first epitaxial layer 120 has been formed. In the illustrated embodiment, the base layer 110 is a highly doped silicon layer, and the first epitaxial layer 120 is a lightly doped silicon layer grown using conventional epitaxial growth techniques known to those of ordinary skill in the art. For example, a chemical vapor deposition ("CVD") process using a silicon source such as silicon tetrachloride ($SiCl_4$), silane ($SiH_4$), or dichlorosilane ($SiH_2Cl_2$) may be employed to form the first epitaxial layer 120. The particular process chosen may depend on well known factors such as deposition temperature, film quality, growth rate, and compatibility with a particular CVD system being used.

Figure 3:
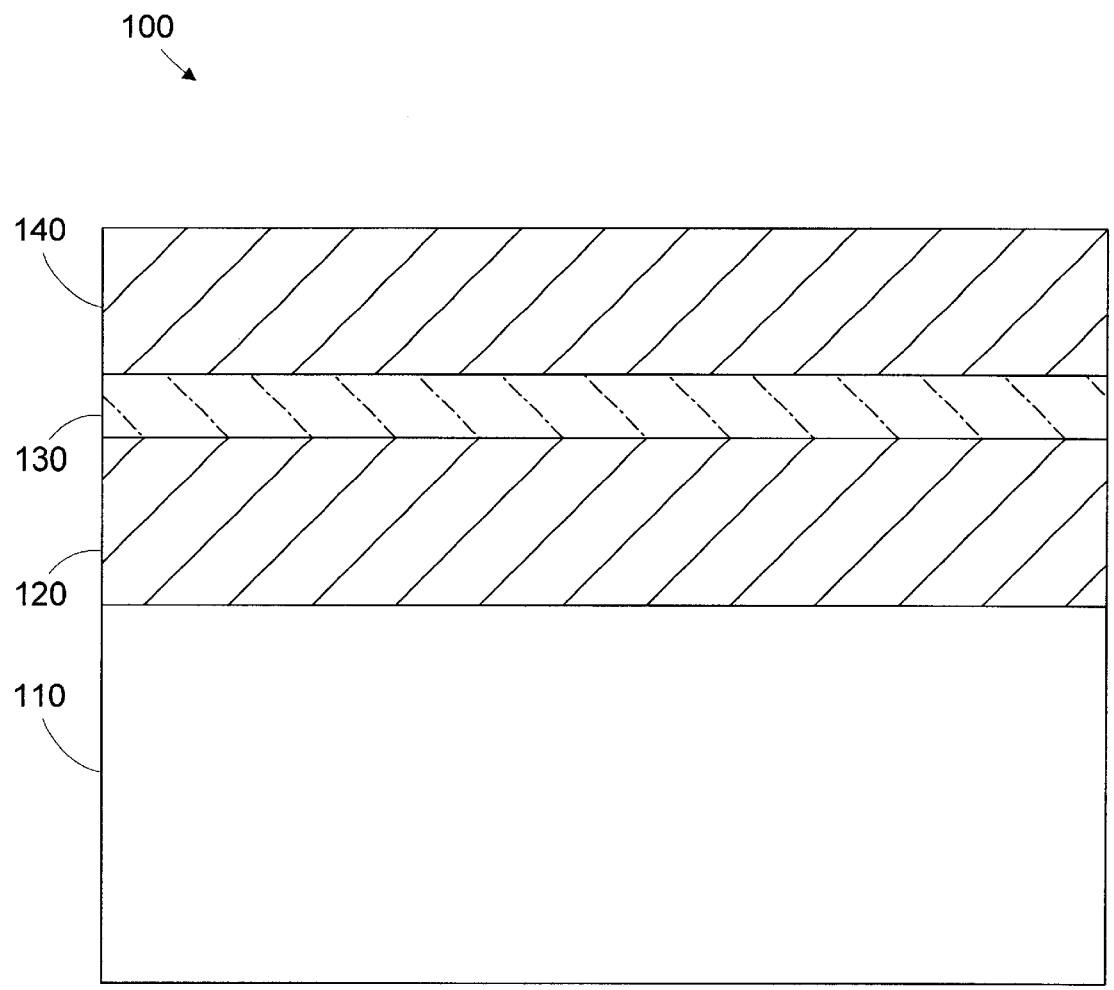
FIG. 3 is a cross section view of the semiconductor device of FIG. 2 after a highly doped epitaxial layer has been formed above the highly doped epitaxial layer.

As shown in FIG. 3, a second epitaxial layer 130 is formed above the first epitaxial layer 120. The second epitaxial layer 130 has a dopant concentration higher than the first epitaxial layer 120. The dopant concentration of the second epitaxial layer 130 corresponds to the desired dopant concentration of a well to be later formed in the semiconductor device 100. Techniques for varying the dopant concentration in the CVD process used to form the second epitaxial layer 130 are well known to those of ordinary skill in the art. A third epitaxial layer 140 is formed above the second epitaxial layer 130. The third epitaxial layer 140 has a dopant concentration similar to that of the first epitaxial layer 120. Exemplary thicknesses of the epitaxial layers 120, 130, 140 are 1.0, 0.3, and 0.7 microns, respectively. Exemplary dopant concentrations of the epitaxial layers 120, 130, 140 are $1 \times 10^{16}$, $1 \times 10^{17}$, and $1 \times 10^{16}$ ions/cm$^2$, respectively.

Figure 4:
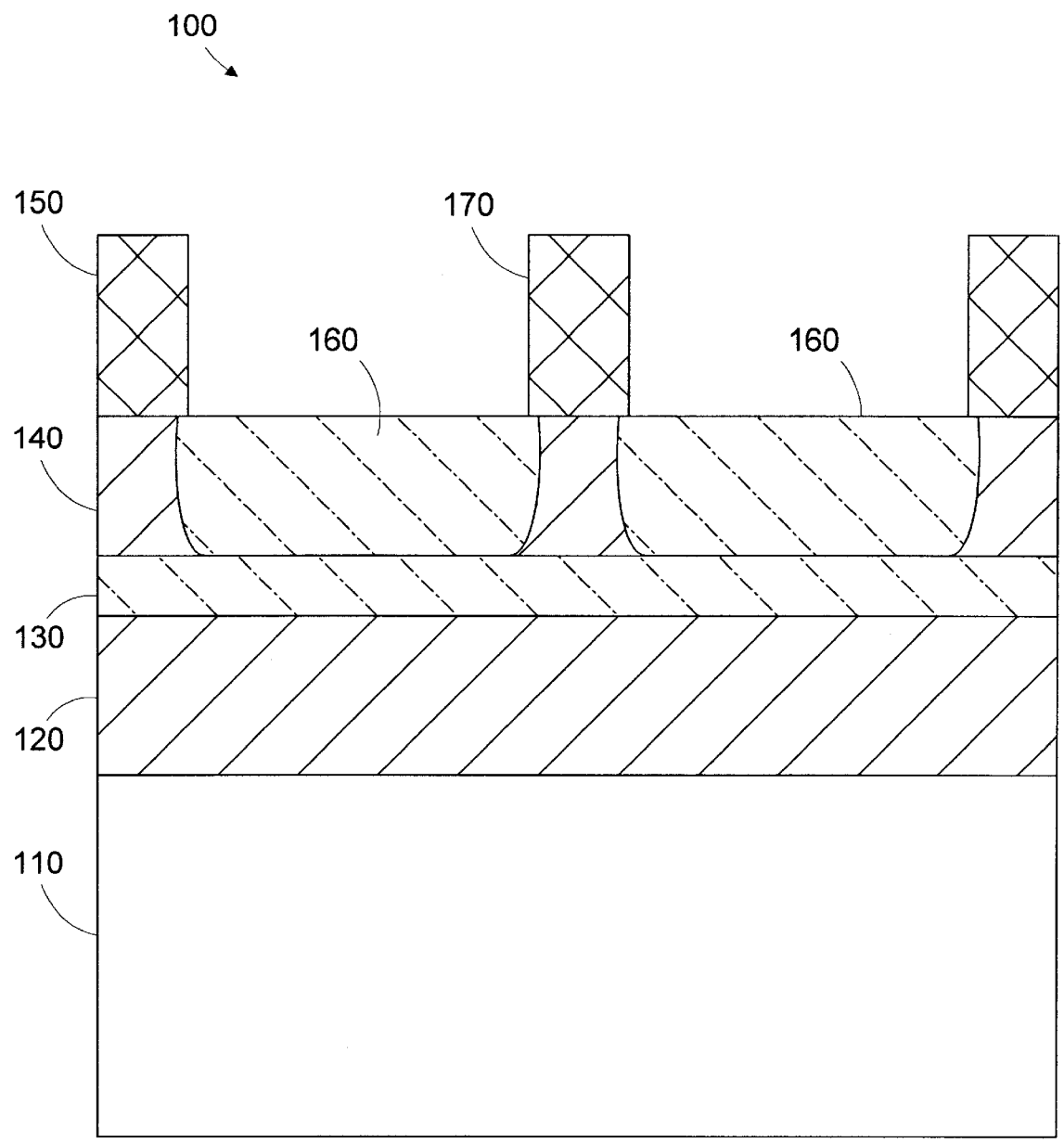
FIG. 4 is a cross section view of the semiconductor device of FIG. 3 after wells have been formed.

Turning to FIG. 4, a photoresist layer 150 formed above the third epitaxial layer 140 and patterned to expose portions of the third epitaxial layer 140. An implantation process is used to form wells 160. The wells 160 contact the second epitaxial layer 130, thus making the effective depth of the wells 160 equal to the depth of the implanted portion plus the depth of the second epitaxial layer 130. The dopant concentrations of the wells 160 and the second epitaxial layer 130 are similar. Because the highest energy implants are avoided during formation of the wells 160, the thickness of the photoresist layer 150 is reduced. Hence, the aspect ratio of the portion 170 of the photoresist layer 150 disposed between the wells 160 is also reduced.

The dopant profile of the wells 160 may be controlled by selection of the doping level selected for the second epitaxial layer 130. In one embodiment, the dopant concentration of the portion of the wells 160 formed by implantation is the same as the dopant concentration of the second epitaxial layer 130. Alternatively, the doping concentration of the second epitaxial layer 130 may be less than the implanted dopant concentration of the wells 160 to provide a doping gradient.

Figure 5:
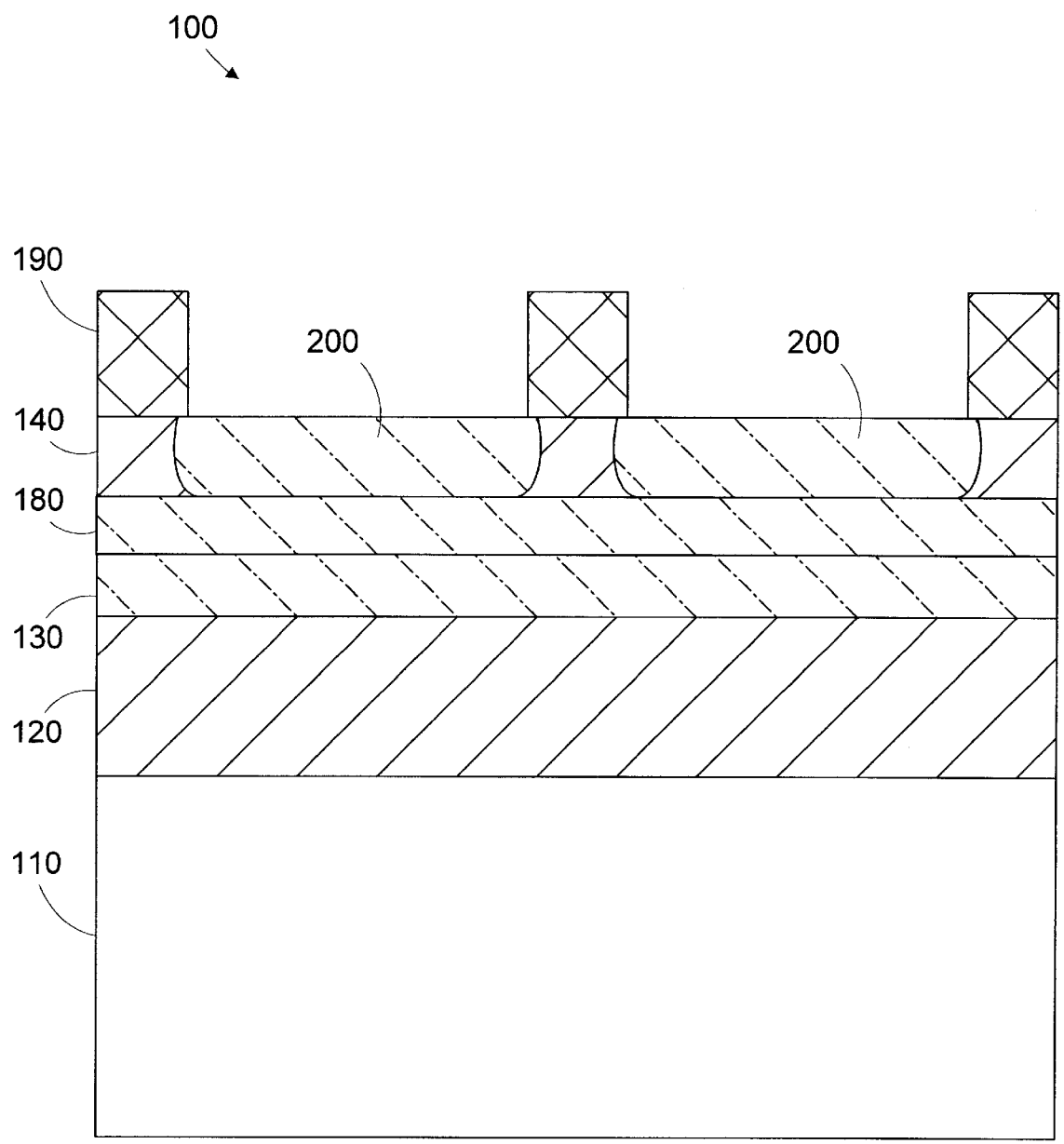
FIG. 5 is a cross section view of an alternative embodiment of a semiconductor device including two highly doped epitaxial layers.

FIG. 5 shows an alternative embodiment where a fourth epitaxial layer 180 is disposed between the second and third epitaxial layers 130, 140. The fourth epitaxial layer 180 may be used to further tailor the dopant concentration profile. The thickness, hence the aspect ratio, of the photoresist layer 190 in the embodiment of FIG. 5 is further reduced. Wells 200 are formed using conventional implantation techniques.

The specific thicknesses and dopant concentrations of the intermediate epitaxial layers 130, 180 are application dependent. Any number of intermediate layers 130, 180 may be formed depending on the desired dopant concentration profile. The depth of the intermediate epitaxial layers 130, 180 below the third epitaxial layer 140 is may also be varied depending on factors such as the highest energy implant supportable for a given photoresist thickness.

In the illustrated embodiment, the base layer 110 is highly doped with a p-type dopant. The epitaxial layers are also doped with p-type dopants with their relative concentrations varying as described above. The epitaxial layers 120, 130, 140, 180 may be either "homoepitaxial" or "heteroepitaxial." A homoepitaxial layer is of the same material as the base layer 110 (i.e., silicon on silicon). A heteroepitaxial layer is of the material different from the substrate (i.e., gallium arsenide (GaAs) on silicon). Whether the epitaxial layer is homoexpitaxial or heteroepitaxial is an implementation specific design choice.

In the illustrated embodiment, the wells 160, 200 are p-wells. In other embodiments, the dopant types used to form the various epitaxial layers 120, 130, 140, 180 may be different. For example, the background dopant may be an n-type dopant. Alternatively, the first and third epitaxial layers 120, 140 may be of one type (e.g., p-type), and the intermediate epitaxial layers 130, 180 and the wells 160, 200 may be of a different type (e.g., n-type). Where dopants are of the same type, they may also be the same dopant material.

During previous or subsequent formation of wells (not shown) having a dopant type different than the intermediate epitaxial layers 130, 180, the dopant concentration may be increased to compensate for the higher complimentary type dopant concentrations of the intermediate epitaxial layers 130. For example, consider that the intermediate epitaxial layers 130, 180 were formed to reduce the photoresist thickness required to form p-wells. During formation of n-wells, the dopant concentration is increased in the depth corresponding to the intermediate epitaxial layers 130, 180. The thickness of the photoresist layer (not shown) used to form the n-wells may be thicker than that required to form the p-wells, because the higher energy implants are not avoided. The layout of the n-wells may be designed to attempt to increase the distance between adjacent n-wells to alleviate the aspect ratio concern. By using this approach, wells of one type (e.g., n or p) may be placed closer to each other, thus making the circuit more dense due to the removal of the constraint associated with the high aspect ratio requirements necessitated by high energy implants.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for forming a semiconductor device, comprising:

providing a base layer;

forming a first epitaxial layer having a first dopant at a first concentration above the base layer;

forming a second epitaxial layer having a second dopant at a second concentration above the first epitaxial layer, the second concentration being greater than the first concentration;

forming a third epitaxial layer having a third dopant at a third concentration above the second epitaxial layer, the third concentration being less than the second concentration; and implanting ions in the third epitaxial layer to form an implant region, the implant region being in contact with the second epitaxial layer.

2. The method of claim 1, further comprising:

forming a photoresist layer above the third epitaxial layer; and patterning the photoresist layer to expose a portion of the third epitaxial layer.

3. The method of claim 2, wherein implanting the ions comprises implanting the ions into the exposed portion of the third epitaxial layer, and forming the photoresist layer comprises forming the photoresist layer having a thickness based on an implant energy necessary for implanting the ions in the third epitaxial layer.

4. The method of claim 1, wherein the third dopant concentration is the same as the first dopant concentration.

5. The method of claim 1, wherein the first, second, and third dopants comprise positive-type dopants.

6. The method of claim 1, wherein the first, second, and third dopants comprise negative-type dopants.

7. The method of claim 1, wherein the first and third dopants comprise positive-type dopants and the second dopant comprises a negative-type dopant.

8. The method of claim 1, further comprising forming a fourth epitaxial layer having a fourth dopant at a fourth concentration intermediate the first and second epitaxial layers, the fourth concentration being different from the second concentration.

9. The method of claim 8, wherein the fourth concentration is less than the second concentration.

10. The method of claim 8, wherein the fourth dopant is of the same type as the second dopant.

11. The method of claim 8, wherein the second and fourth dopants comprise the same dopant material.

12. The method of claim 1, wherein the first, second, and third dopants comprise the same dopant material.

* * * * *